United States Patent
Mandegaran

(10) Patent No.: US 9,912,326 B2
(45) Date of Patent: Mar. 6, 2018

(54) METHOD FOR TUNING FEED-FORWARD CANCELLER

(71) Applicant: Abtum Inc., Irvine, CA (US)

(72) Inventor: Sam Mandegaran, Pasadena, CA (US)

(73) Assignee: ABTUM INC., Irvine, CA (US)

( * ) Notice: Subject to any disclaimer, the term of this patent is extended or adjusted under 35 U.S.C. 154(b) by 0 days.

(21) Appl. No.: 15/208,394

(22) Filed: Jul. 12, 2016

(65) Prior Publication Data

US 2017/0070217 A1 Mar. 9, 2017

Related U.S. Application Data

(60) Provisional application No. 62/215,473, filed on Sep. 8, 2015.

(51) Int. Cl.
*H03K 5/00* (2006.01)
*H03K 5/125* (2006.01)
*H04L 5/14* (2006.01)
*H04B 1/40* (2015.01)

(52) U.S. Cl.
CPC ............. *H03K 5/125* (2013.01); *H04B 1/40* (2013.01); *H04L 5/14* (2013.01); *H04L 5/1461* (2013.01)

(58) Field of Classification Search
CPC ............. H03K 5/125; H04L 5/11; H04D 1/40
USPC .................. 327/551–559; 342/174, 175, 198
See application file for complete search history.

(56) References Cited

U.S. PATENT DOCUMENTS

| | | |
|---|---|---|
| 2,561,212 A | 7/1951 | Lewis |
| 3,025,463 A | 3/1962 | Luoma et al. |
| 3,453,638 A | 7/1969 | Hoovler |
| 3,704,409 A | 11/1972 | Oomen |
| 3,800,218 A | 3/1974 | Shekel |
| 4,029,902 A | 6/1977 | Bell et al. |
| 4,146,851 A | 3/1979 | Dempsey et al. |
| 4,427,936 A | 1/1984 | Riblet et al. |
| 4,464,675 A | 8/1984 | Balaban et al. |
| 4,489,271 A | 12/1984 | Riblet |
| 4,694,266 A | 9/1987 | Wright |
| 4,721,901 A | 1/1988 | Ashley |
| 4,963,945 A | 10/1990 | Cooper et al. |
| 4,964,945 A | 10/1990 | Cooper et al. |

(Continued)

FOREIGN PATENT DOCUMENTS

| | | | |
|---|---|---|---|
| DE | 102012107877 A1 | 2/2014 |
| EP | 1091497 A1 | 4/2001 |

(Continued)

OTHER PUBLICATIONS

EESR for European Appl. No. 13876497.2, dated Jul. 4, 2016.

(Continued)

*Primary Examiner* — Dinh T Le

(74) *Attorney, Agent, or Firm* — McAndrews, Held & Malloy, Ltd.

(57) ABSTRACT

A method for maintaining good cancelation in a passive feed-forward cancelation circuit is disclosed. The feed-forward cancelation circuit may include at least one path which may comprise a phase-shifter and a variable attenuator. This method uses the complex value of the reflection coefficient at the point where the communication device is connected to a transmission medium, such as an antenna, to determine the values for the phase shifter(s) and the variable attenuator(s).

19 Claims, 14 Drawing Sheets

(56) References Cited

U.S. PATENT DOCUMENTS

| | | | |
|---|---|---|---|
| 4,968,967 A | 11/1990 | Stove | |
| 5,408,690 A | 4/1995 | Ishikawa et al. | |
| 5,483,248 A | 1/1996 | Milroy | |
| 5,493,246 A | 2/1996 | Anderson | |
| 5,525,945 A | 6/1996 | Chiappella et al. | |
| 5,574,400 A | 11/1996 | Fukuchi | |
| 5,691,978 A | 11/1997 | Kenworthy | |
| 5,781,084 A | 7/1998 | Rhodes | |
| 6,178,310 B1 | 1/2001 | Jeong | |
| 6,194,980 B1 | 2/2001 | Thon | |
| 6,229,992 B1 | 5/2001 | McGeehan et al. | |
| 6,262,637 B1 | 7/2001 | Bradley et al. | |
| 6,297,711 B1 | 10/2001 | Seward et al. | |
| 6,496,061 B1 | 12/2002 | Bloom | |
| 6,721,544 B1 | 4/2004 | Franca-Neto | |
| 6,819,302 B2 | 11/2004 | Volman | |
| 6,946,847 B2 * | 9/2005 | Nishimori | H03H 11/30 324/600 |
| 7,072,614 B1 | 7/2006 | Kasperkovitz | |
| 7,116,966 B2 | 10/2006 | Hattori et al. | |
| 7,123,883 B2 | 10/2006 | Mages | |
| 7,250,830 B2 | 7/2007 | Layne et al. | |
| 7,283,793 B1 | 10/2007 | McKay | |
| 7,330,500 B2 | 2/2008 | Kouki | |
| 7,369,811 B2 * | 5/2008 | Bellantoni | G06K 7/0008 375/295 |
| 7,623,005 B2 | 11/2009 | Johansson et al. | |
| 7,633,435 B2 | 12/2009 | Meharry et al. | |
| 7,636,388 B2 * | 12/2009 | Wang | H04B 3/46 324/533 |
| 7,711,329 B2 | 5/2010 | Aparin et al. | |
| 7,804,383 B2 | 9/2010 | Volatier et al. | |
| 7,894,779 B2 | 2/2011 | Meiyappan et al. | |
| 8,013,690 B2 | 9/2011 | Miyashiro | |
| 8,135,348 B2 | 3/2012 | Aparin | |
| 8,149,742 B1 | 4/2012 | Sorsby | |
| 8,199,681 B2 | 6/2012 | Zinser et al. | |
| 8,385,871 B2 | 2/2013 | Wyville | |
| 8,422,412 B2 | 4/2013 | Hahn | |
| 8,514,035 B2 | 8/2013 | Mikhemar et al. | |
| 8,600,329 B1 | 12/2013 | Comeau et al. | |
| 8,620,246 B2 | 12/2013 | McKinzie et al. | |
| 8,749,321 B2 | 6/2014 | Kim et al. | |
| 8,761,026 B1 | 6/2014 | Berry et al. | |
| 8,942,657 B2 * | 1/2015 | McKinzie, III | H03H 7/40 455/178.1 |
| 8,957,742 B2 | 2/2015 | Spears et al. | |
| 9,048,805 B2 | 6/2015 | Granger et al. | |
| 9,214,718 B2 | 12/2015 | Mow et al. | |
| 9,450,553 B2 | 9/2016 | Langer et al. | |
| 9,479,214 B2 * | 10/2016 | Webb | H04B 1/525 |
| 9,490,866 B2 | 11/2016 | Goel et al. | |
| 9,500,727 B2 * | 11/2016 | Sohn | G01R 33/34092 |
| 9,543,630 B2 | 1/2017 | Tokumitsu et al. | |
| 9,590,794 B2 | 3/2017 | Behnam et al. | |
| 2002/0089396 A1 | 7/2002 | Noguchi et al. | |
| 2003/0109077 A1 | 6/2003 | Kim et al. | |
| 2004/0000425 A1 | 1/2004 | White et al. | |
| 2004/0127178 A1 | 7/2004 | Kuffner | |
| 2004/0180633 A1 | 9/2004 | Nakatani et al. | |
| 2005/0070232 A1 | 3/2005 | Mages | |
| 2005/0245213 A1 | 11/2005 | Hirano et al. | |
| 2005/0289632 A1 | 12/2005 | Brooks | |
| 2006/0019611 A1 | 1/2006 | Mages | |
| 2007/0105509 A1 | 5/2007 | Muhammad | |
| 2008/0128901 A1 | 6/2008 | Zurcher et al. | |
| 2008/0227409 A1 | 9/2008 | Chang et al. | |
| 2008/0240000 A1 | 10/2008 | Kidd | |
| 2008/0261519 A1 | 10/2008 | Demarco et al. | |
| 2009/0054008 A1 | 2/2009 | Satou | |
| 2009/0121797 A1 | 5/2009 | Karabatsos | |
| 2009/0125253 A1 | 5/2009 | Blair et al. | |
| 2009/0252252 A1 | 10/2009 | Kim et al. | |
| 2009/0253385 A1 | 10/2009 | Dent et al. | |
| 2009/0289744 A1 | 11/2009 | Miyashiro | |
| 2010/0002620 A1 | 1/2010 | Proctor et al. | |
| 2010/0084146 A1 | 4/2010 | Roberts | |
| 2010/0109771 A1 | 5/2010 | Baik et al. | |
| 2010/0127795 A1 | 5/2010 | Bauer et al. | |
| 2010/0134700 A1 | 6/2010 | Robert et al. | |
| 2010/0148886 A1 | 6/2010 | Inoue et al. | |
| 2010/0177917 A1 | 7/2010 | Van Der Werf | |
| 2010/0323654 A1 | 12/2010 | Judson et al. | |
| 2011/0069644 A1 | 3/2011 | Kim et al. | |
| 2011/0080229 A1 | 4/2011 | Kennington | |
| 2011/0080856 A1 | 4/2011 | Kenington | |
| 2011/0134810 A1 | 6/2011 | Yamamoto et al. | |
| 2011/0140803 A1 | 6/2011 | Kim et al. | |
| 2011/0227664 A1 | 9/2011 | Wyville | |
| 2011/0256857 A1 | 10/2011 | Chen et al. | |
| 2012/0007605 A1 | 1/2012 | Benedikt | |
| 2012/0063496 A1 | 3/2012 | Giannini et al. | |
| 2012/0075069 A1 | 3/2012 | Dickey | |
| 2012/0140860 A1 | 6/2012 | Rimini et al. | |
| 2012/0154071 A1 | 6/2012 | Bradley et al. | |
| 2012/0161784 A1 | 6/2012 | Benedikt | |
| 2012/0163245 A1 | 6/2012 | Tone et al. | |
| 2012/0194269 A1 | 8/2012 | Schlager | |
| 2012/0201153 A1 | 8/2012 | Bharadia et al. | |
| 2012/0201173 A1 | 8/2012 | Jain et al. | |
| 2012/0212304 A1 | 8/2012 | Zhang et al. | |
| 2012/0230227 A1 | 9/2012 | Weiss | |
| 2013/0016634 A1 | 1/2013 | Smiley | |
| 2013/0063299 A1 | 3/2013 | Proudkii | |
| 2013/0065542 A1 | 3/2013 | Proudkii | |
| 2013/0079641 A1 | 3/2013 | Zwirn | |
| 2013/0083703 A1 | 4/2013 | Granger-Jones et al. | |
| 2013/0109330 A1 | 5/2013 | Sahota et al. | |
| 2013/0113576 A1 | 5/2013 | Inoue et al. | |
| 2013/0130619 A1 | 5/2013 | Harverson et al. | |
| 2013/0154887 A1 | 6/2013 | Hein et al. | |
| 2013/0201880 A1 | 8/2013 | Bauder et al. | |
| 2013/0201881 A1 | 8/2013 | Bauder et al. | |
| 2013/0201882 A1 | 8/2013 | Bauder et al. | |
| 2013/0222059 A1 | 8/2013 | Kilambi et al. | |
| 2013/0241655 A1 | 9/2013 | Liss et al. | |
| 2013/0241669 A1 | 9/2013 | Mikhemar et al. | |
| 2013/0242809 A1 | 9/2013 | Tone et al. | |
| 2013/0245976 A1 | 9/2013 | Hind | |
| 2013/0301488 A1 | 11/2013 | Hong et al. | |
| 2013/0321097 A1 | 12/2013 | Khlat et al. | |
| 2014/0103946 A1 | 4/2014 | Vanden Bossche | |
| 2014/0169236 A1 | 6/2014 | Choi et al. | |
| 2014/0194073 A1 | 7/2014 | Wyville et al. | |
| 2014/0204808 A1 | 7/2014 | Choi et al. | |
| 2014/0348018 A1 * | 11/2014 | Bharadia | H04L 5/1461 370/252 |
| 2014/0376419 A1 | 12/2014 | Goel et al. | |
| 2015/0049841 A1 | 2/2015 | Laporte et al. | |
| 2015/0118978 A1 | 4/2015 | Khlat | |
| 2015/0163044 A1 | 6/2015 | Analui et al. | |
| 2015/0236390 A1 | 8/2015 | Analui et al. | |
| 2015/0236395 A1 | 8/2015 | Analui et al. | |
| 2015/0236842 A1 | 8/2015 | Goel et al. | |
| 2016/0050031 A1 | 2/2016 | Hwang et al. | |
| 2016/0134325 A1 | 5/2016 | Tageman et al. | |
| 2016/0204821 A1 | 7/2016 | Han et al. | |
| 2016/0211870 A1 | 7/2016 | Wu et al. | |
| 2016/0380706 A1 | 12/2016 | Tanzi et al. | |
| 2017/0030339 A1 | 2/2017 | Proudfoot | |
| 2017/0070368 A1 | 3/2017 | Mandegaran | |

FOREIGN PATENT DOCUMENTS

| | | | |
|---|---|---|---|
| EP | 2733855 A1 | 5/2014 | |
| EP | 2814172 A1 | 12/2014 | |
| EP | 2960981 A1 | 12/2015 | |
| KR | 10-2010-0134324 A | 12/2010 | |
| WO | 9515018 A1 | 6/1995 | |
| WO | 2014032883 A1 | 3/2014 | |
| WO | 2014133625 A2 | 9/2014 | |

(56) References Cited

FOREIGN PATENT DOCUMENTS

| WO | 2015089091 A1 | 6/2015 |
|---|---|---|
| WO | 2016063108 A1 | 4/2016 |

OTHER PUBLICATIONS

Office Action for U.S. Appl. No. 14/626,572, dated Jul. 15, 2016.
Office Action for U.S. Appl. No. 14/622,627, dated May 20, 2016.
Office Action for U.S. Appl. No. 14/626,572, dated Mar. 31, 2016.
ISR for Application No. PCT/US2016/050466, dated Nov. 29, 2016.
Office Action for U.S. Appl. No. 14/626,572, dated Jul. 29, 2015.
ISR and Written Opinion for PCT Application No. PCT/US2015/016642, dated Jun. 25, 2015.
Hunter et al., "Passive Microwave Receive Filter Networks Using Low-Q Resonators," IEEE Microwave Magazine, pp. 46-53, (2005).
Laforge et al., "Diplexer design implementing highly miniaturized multilayer superconducting hybrids and filters," IEEE Transactions on Applied Superconductivity, pp. 47-54, (2009).
Marcatili et al., "Band-Splitting Filter," Bell System Technical Journal, pp. 197-212, (1961).
Matthaei et al., "Microwave Filters, Impedance-Matching Networks, and Coupling Structures," Chapter 14: Directional, Channel-Separation Filters and Traveling-WAve Ring-Resonators, pp. 843-887, Copyright 1980 Artech House, Inc., Dedham, MA; reprint of edition published by McGraw-Hill Book Company, 1964.
Matthaei et al., "Microwave Filters, Impedance-Matching Networks, and Coupling Structures," Chapter 16: Multiplexer Design, pp. 965-1000, Copyright 1980 Artech House, Inc., Dedham, MA; reprint of edition published by McGraw-Hill Book Company, 1964.
Phudpong et al., "Nonlinear Matched Reflection Mode and stop Filters for Frequency Selective Limiting Applications," Microwave Symposium Conference, IEEE/MTT-S International, pp. 1043-1046, (2007).
ISR and Written Opinion for PCT/US2014/069372, dated Mar. 3, 2015.
ISR and Written Opinion for PCT/US2015/016145, dated May 20, 2015.
ISR and Written Opinion for PCT/US2015/015930, dated May 27, 2015.
Korean International Searching Authority, ISR and Written Opinion for PCT/US2013/074155, dated Sep. 23, 2014.
Kannangara et al., "Analysis of an Adaptive Wideband Duplexer With Double-Loop Cancellation," IEEE Transactions on Vehicular Technology, vol. 56, No. 4, pp. 1761-1982, (2007).
Notice of Allowance for U.S. Appl. No. 14/102,244, dated Jul. 20, 2016.
Office Action for U.S. Appl. No. 14/102,244, dated Sep. 22, 2015.
Office Action for U.S. Appl. No. 14/102,244, dated Jun. 15, 2015.
ISR and Written Opinion for PCT/2016/054646, dated Dec. 29, 2016.

* cited by examiner

METHOD FOR TUNING FEED-FORWARD CANCELLER

CROSS-REFERENCE TO RELATED APPLICATIONS/INCORPORATION BY REFERENCE

This patent application makes reference to, claims priority to, and claims benefit from U.S. Provisional Application No. 62/215,473, filed on Sep. 8, 2015.

The above-referenced application is hereby incorporated herein by reference in its entirety.

FIELD OF THE DISCLOSURE

Certain embodiments of the disclosure relate to communication systems supporting simultaneous transmit and receive, co-existent communication devices, systems using enhanced isolation between certain ports or blocks, and other systems where signal cancellations are achieved through feed-forward cancelation. More specifically, certain embodiments of the disclosure relate to a method and system for tuning feed-forward canceller.

BACKGROUND OF THE DISCLOSURE

Radio frequency (RF) filters and duplexers have been essential components of communication systems. High selectivity, low insertion loss, compact size, ability to handle large signals (power handling), high linearity, manufacturability, and low cost may be some of the important desired features for RF filters and duplexers.

The requirements for RF filters and duplexers have become more stringent in light of new communication standards where information channels and frequency bands are closer to each other, new communication devices such as smartphones where the footprint and cost of all components must be very small as more components are needed in support of multiple standards and applications, and co-existent communication systems where multiple communication transmitters and receivers work simultaneously.

In radars, the relatively strong transmitter waveform should be isolated from radar's sensitive receiver that is designed to detect relatively small reflected waveforms. Certain level of isolation may be achieved by using two separate antennas for the transmitter and the receiver, or a circulator that interfaces a common antenna to the transmitter and the receiver. The isolation provided by such conventional methods may not be sufficient.

What is needed are tuning feed-forward cancellation schemes that may be added to reduce the level of unwanted signals and to enhance the isolation between desired blocks within a system. Cancellers may remove the need for selective filtering or relax the filtering requirements.

Further limitations and disadvantages of conventional and traditional approaches will become apparent to one of skill in the art, through comparison of such systems with the present disclosure as set forth in the remainder of the present application with reference to the drawings.

BRIEF SUMMARY OF THE DISCLOSURE

A system and/or method for tuning feed-forward canceller, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated.

DETAILED DESCRIPTION OF THE DISCLOSURE

Figure 1:
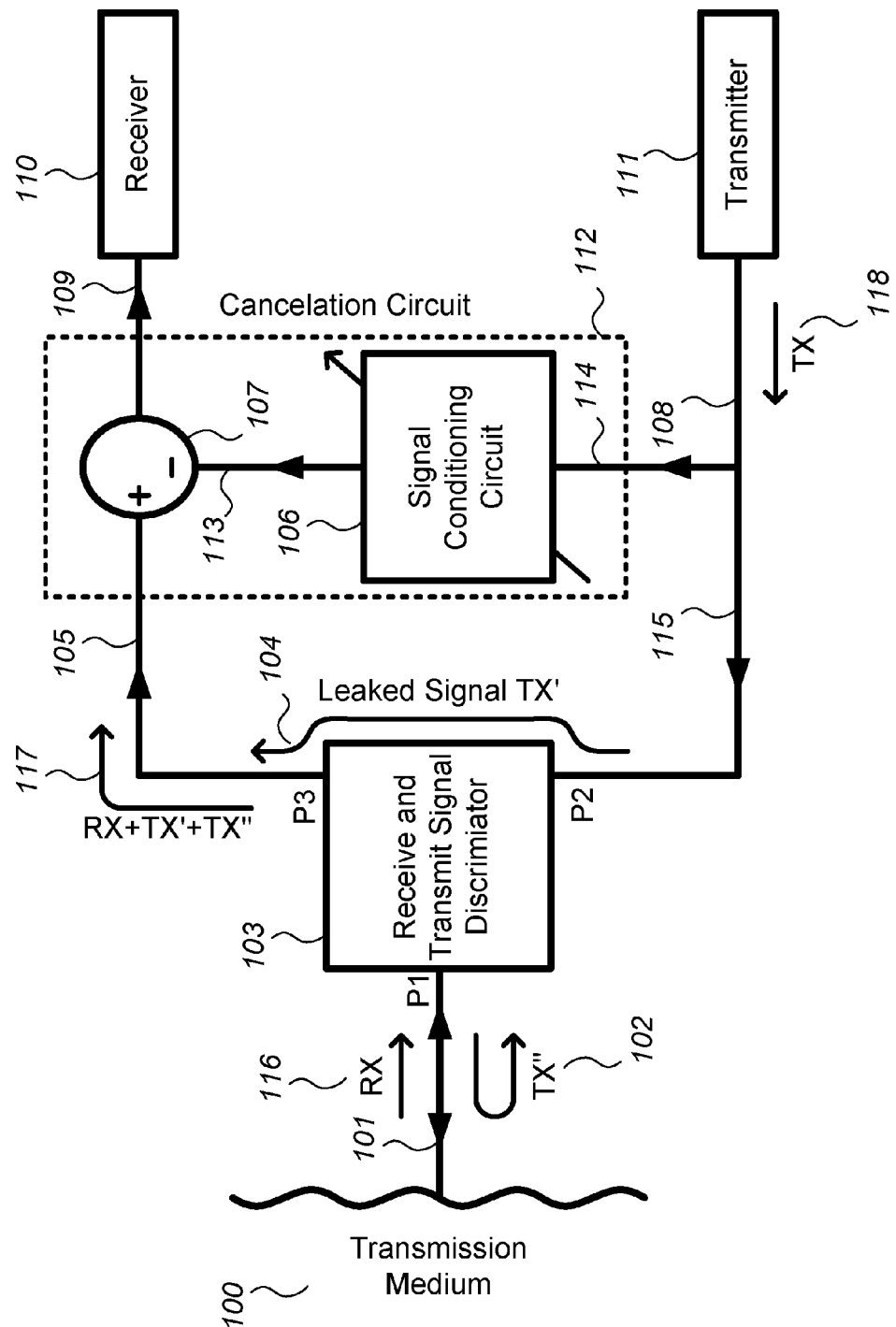
FIG. 1 illustrates a typical system where the method could be used.

As utilized herein the terms "circuit" and "circuitry" refer to physical electronic components (i.e. hardware) and any software and/or firmware ("code") which may configure the hardware, be executed by the hardware, and/or otherwise be associated with the hardware. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the term "exemplary" means serving as a non-limiting example, instance, or illustration. As utilized herein, the terms "e.g.," and "for example" set off lists of one or more non-limiting examples, instances, or illustrations.

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated.

Represented results of various embodiments are only for illustrative reasons, and are not meant to cover all possible responses that various embodiments enable. For instance, the presented results cover filters with a single passband and at least one stopband (or notch) in their transfer functions. Filters with multiple passbands or stopbands may also be realized using the embodiments or other teachings of this disclosure. Filters whose transfer functions fundamentally change as a function of at least one stimulus may also be realized using the embodiments or other teachings of this disclosure.

In a communication device or system, a portion of the transmit signal may leak to the receive signal path. The leakage may either make receiving impossible or degrade the receive signal.

The aforementioned leakage may occur when the transmit signal bounces at the boundary of the transmission medium that is common to the transmitter and receiver. For instance, an impedance mismatch between the antenna and the circuitry that connects to it may create unwanted signal reflection or bouncing. As an example, a communication system may use a common antenna to support a receiver and transmitter. The common antenna may be connected to the transmitter and receiver through a frequency duplexer or multiplexer, circulator, or other passive networks depending on the system specifics. In an example embodiment, the communication system may be a frequency division duplex wireless communication system. In another example embodiment, the communication system may be a radar system.

One challenge is that the specifics of the leakage signal may change over time. For instance, the antenna impedance may change as the electromagnetic environment around the antenna changes. A change in the antenna impedance may cause a change in the unwanted transmit signal that leaks to the receive signal path.

Figure 2:
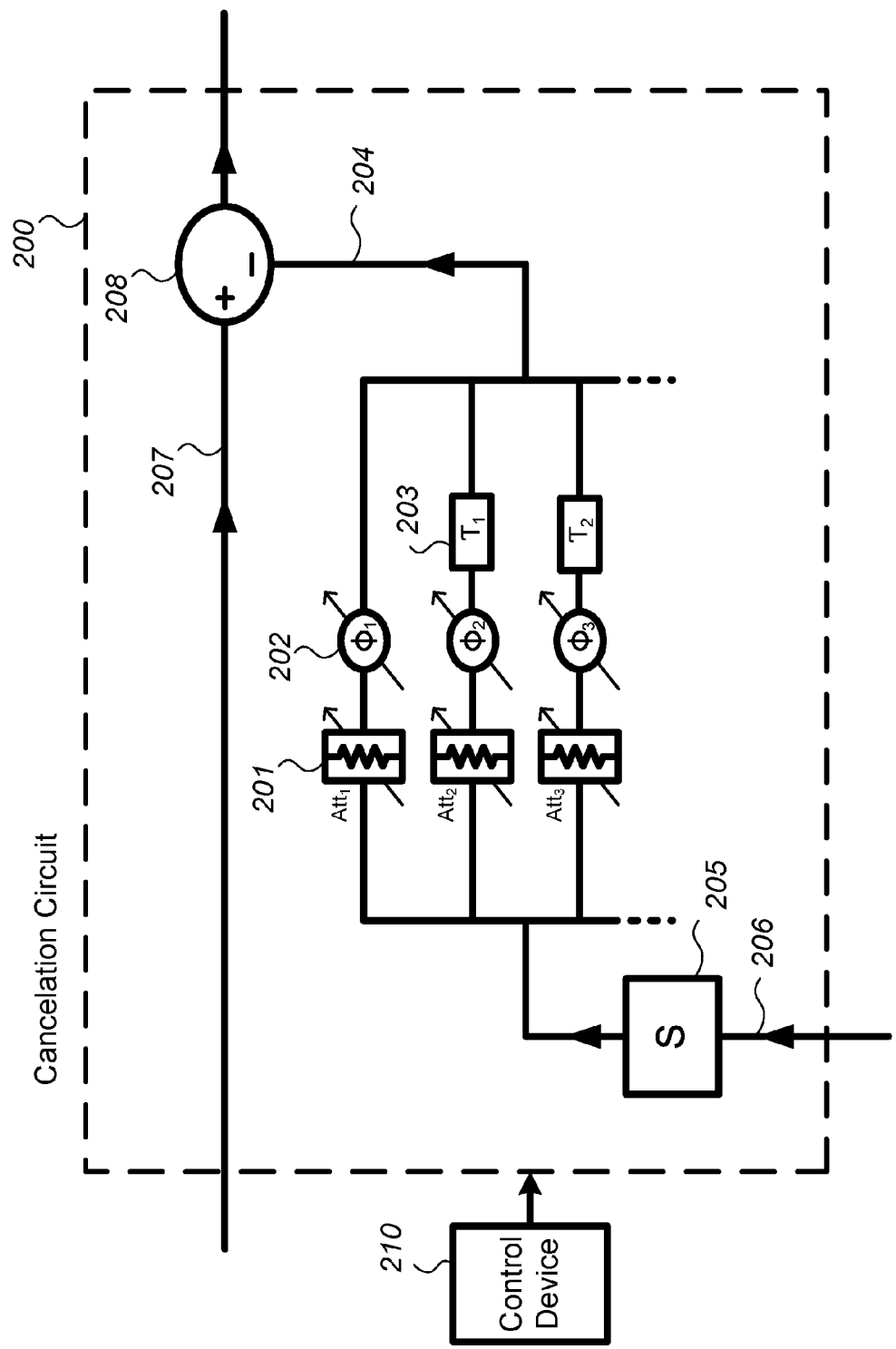
FIG. 2 illustrates a typical feed-forward cancelation circuit.

One method to mitigate this problem is to cancel the leaked transmit signal from the receive path using a feed-forward cancelation circuit, such as shown in FIG. 1. Such a feed-forward circuit may comprise parallel paths as shown in FIG. 2. Each path may comprise, for example, an attenuator, a phase shifter and/or a time delay where each component may be fixed or variable. In order to achieve best cancelation, the variable attenuators and the phase-shifters must be set to specific values. Due to different reasons, the impedance of the transmission medium may change. When this happens, the system needs to change the settings for the variable attenuators and the phase-shifters to maintain good cancelation. The impedance mismatch of the transmission medium could be quantified with the reflection coefficient which is a complex number and has a magnitude and a phase.

This disclosure discloses a method to change the settings for the variable attenuators and the phase-shifters when the reflection coefficient has changed. It uses the old and new complex values of the reflection coefficient to determine the new settings. The method may also include a lookup table to correct for small non-ideal effects.

FIG. 1 illustrates a typical system where the method could be used.

The receive and transmit signal discriminator 103 is a three port device that transfers most of the desired receive signal from port P1 to port P3 and most of the desired transmit signal from port P2 to port P1. Two examples of such devices are a circulator and a duplexer. The receive and transmit signal discriminator 103 may also include passive components that enable connections of a transmitter and receiver to a common transmission medium.

Transmission Medium 100 is any medium where the incoming receive signal will be traveling through and where the outgoing transmit signal will be travel away from our system. Examples of such medium are free space (in wireless communications) and an electromagnetic cable (in wired communications). There may be other components present between the receive and transmit signal discriminator 103 and the transmission medium 100. For instance, in wireless communications, antenna is used to convert the transmitting and receiving signals to propagating waves and vice versa. In our descriptions, we will consider these additional components to be included as part of Transmission Medium 100. A transmission medium 100 may cause the transmit signal to reflect back to the system 102 due to an impedance mismatch between the transmission medium and path 101, or an impedance mismatch between the transmission medium 100 and port P1 of the discriminator 103.

In an ideal system, all of the transmit signal TX 118 will go from port P2 to port P1 of the discriminator 103 and then all of the TX signal will go to the Transmission Medium 100 while all of an incoming receive signal RX 116 will go from port P1 to port P3 of the discriminator 103 and then to the receiver 110. However, in the real world, the system and especially the discriminator 103 in FIG. 1 are never ideal. Some of the transmit signal TX 118 leaks to the receive signal path 105 and combines with the desired received signal to generate signal 117.

There are two main culprits for the leak:

First, the discriminator 103 is not perfect and signal leaks from port P2 to port P3 as shown by 104. We will call this leaked signal TX'.

Second, the transmit medium 100 may cause a portion of the outgoing signal 101 to reflect back to the discriminator 103 and then to port P3. We will call this reflected signal TX" 102 and the amount of the reflection is determined by the reflection coefficient Γ of the Transmit Medium 100. The reflection coefficient Γ is a complex number; it consists of an amplitude and a phase. It should also be noted that reflection coefficient is not the same as Voltage Standing Wave Ratio (VSWR). VSWR is a one dimensional quantity and is related to the amplitude of Γ.

Signal 117 on signal path 105 will contain RX, TX', and TX". Signals TX', and TX" may contain energy at the receive frequency band/channels or outside or it. Without any provisions, the desired received signal RX may not be fully recovered in presence of signals TX' and TX". In technical terms, undesired signals TX' and TX" may reduce the receiver sensitivity (desensitization) through added noise, reciprocal mixing, pushing the receiver into nonlinear region, intermodulation distortion, etc.

The purpose of cancelation circuit 112 is to cancel most of the signals TX' and TX" from signal 117 so the signal in path 109 will contain signal RX with no or very little of signals TX' and TX". Some systems may require complete or partial cancellation of TX' and TX" signals only at certain frequencies. In other words, the cancellation circuit 112 need not operate uniformly across all frequencies. In an example embodiment, the cancelation circuit 112 may comprise an integrated circuit.

The cancelation transfer function corresponding to the signal conditioning circuit 106 generates a signal 113 that will cancel signals TX' and TX" from path 105. The cancelation is done by a circuit or device 107.

FIG. 2 illustrates a typical configuration of the cancelation circuit 200.

A section of the cancelation circuit 200 may contain one, two, or more parallel paths for the signal. Each path may contain a static or variable attenuator 201 and a static or variable phase shifter 202. One or more paths may include a static or variable time delay element 203. Variable components allow for variable signal conditioning scenarios—this is advantageous in the case of dynamic environments, for example, where the signal reflection due to antenna impedance mismatch changes over time. In such scenarios, proper values for each of the variable components should be set to enable the optimum or an acceptable cancellation in the system. The control signal or signals for such a variable signal conditioning circuit may be originated from various sources or control devices 210 including the transmission medium 100, the receiver 110, the transmitter 111, or other blocks that may be added to the system.

A sub-circuit S 205 conditions the signal and prepares it for the parallel paths. Sub-circuit 205 may contain power divider, coupler, filter, or impedance transformation networks.

Element 208 is a circuit or device that will subtract the signal in path 204 from the signal in path 207. Signal subtraction may occur in voltage, current, or power domain.

Figure 3:
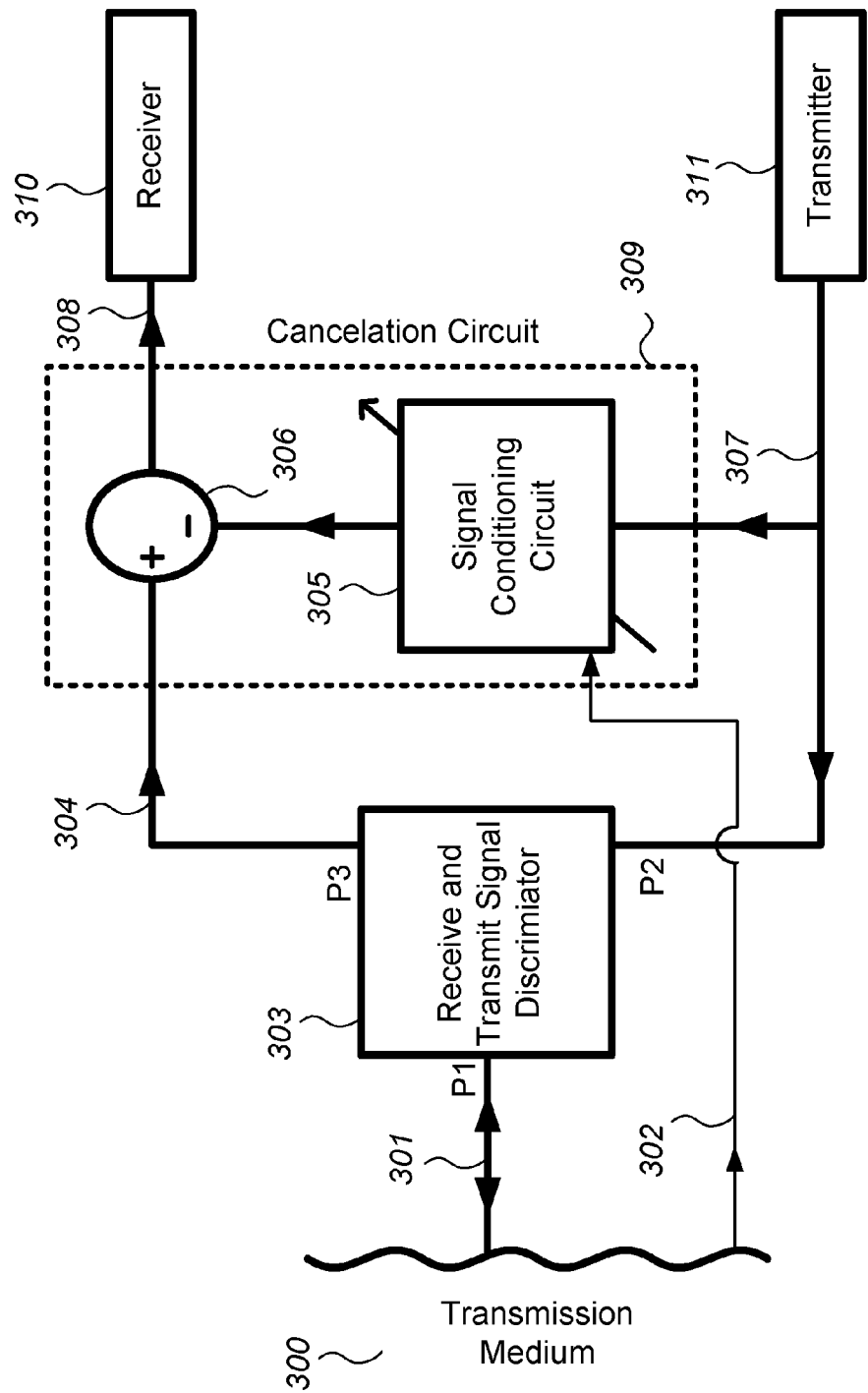
FIG. 3 illustrates a typical system where the method could be used and the feedback comes from the transmit medium.

FIG. 3 illustrates a system where the control signal (or signals) 302 for the variable signal conditioning circuit 305 is originated from the transmission medium 300.

Figure 4:
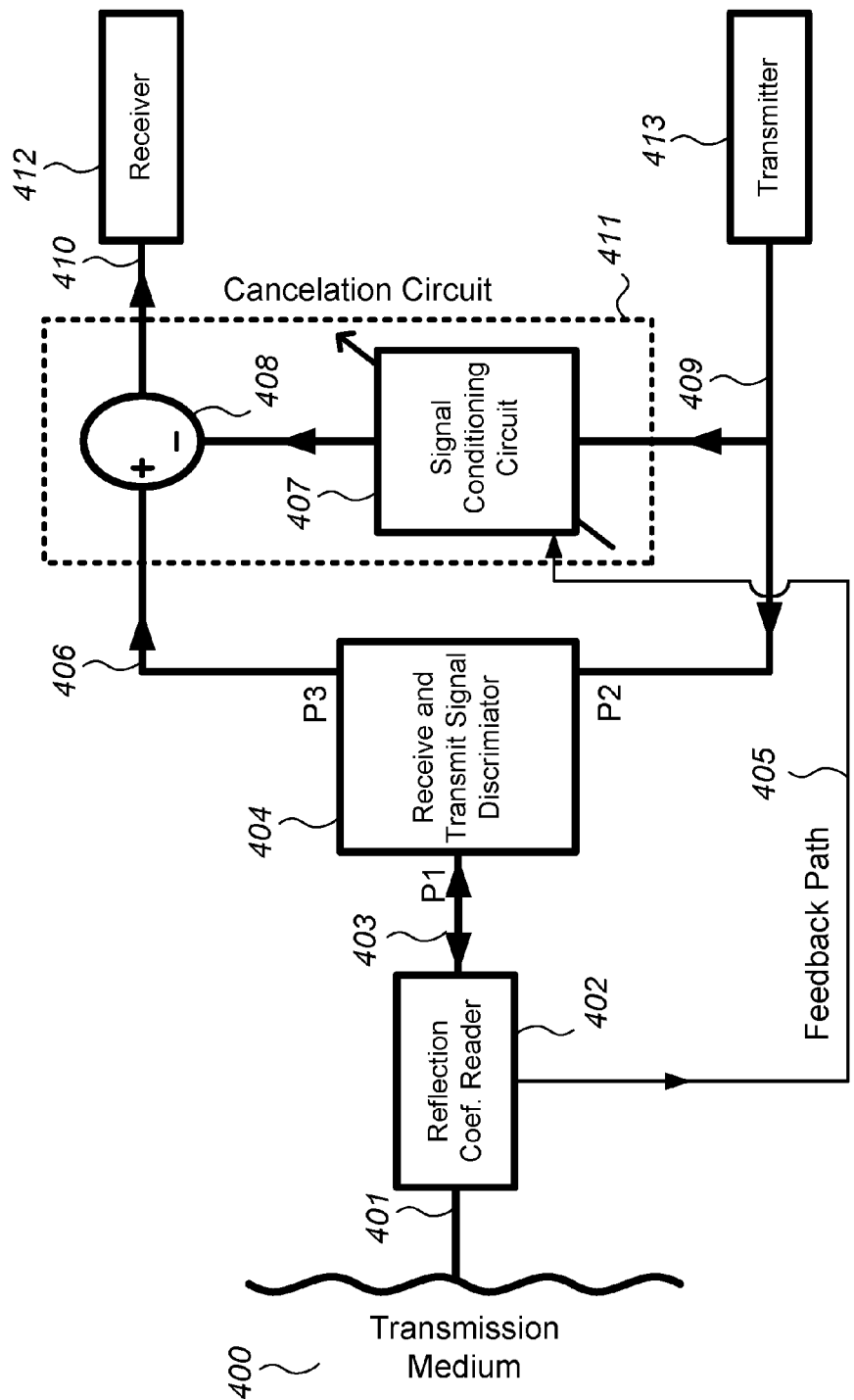
FIG. 4 illustrates a typical system where the method could be used and the feedback comes from a reflection coefficient reader.

FIG. 4 illustrates a system where the control signal (or signals) 405 for the variable signal conditioning circuit 407 is originated from a reflection coefficient reader 402.

Figure 5:
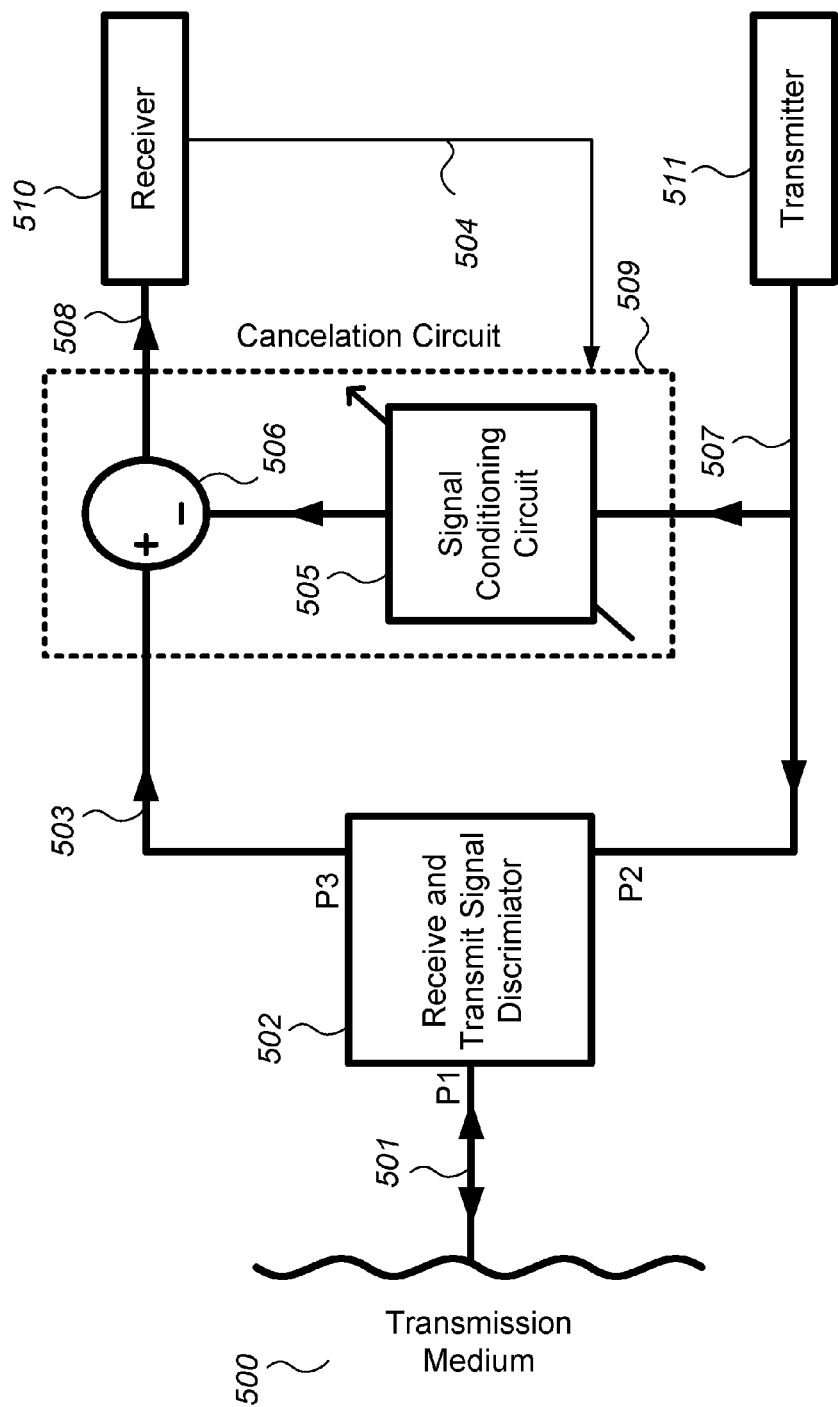
FIG. 5 illustrates a typical system where the method could be used and the feedback comes from outside the system.

FIG. 5 illustrates a system where control signal (or signals) 504 for the variable signal conditioning circuit 505 is originated from the receiver 510.

Figure 6A:
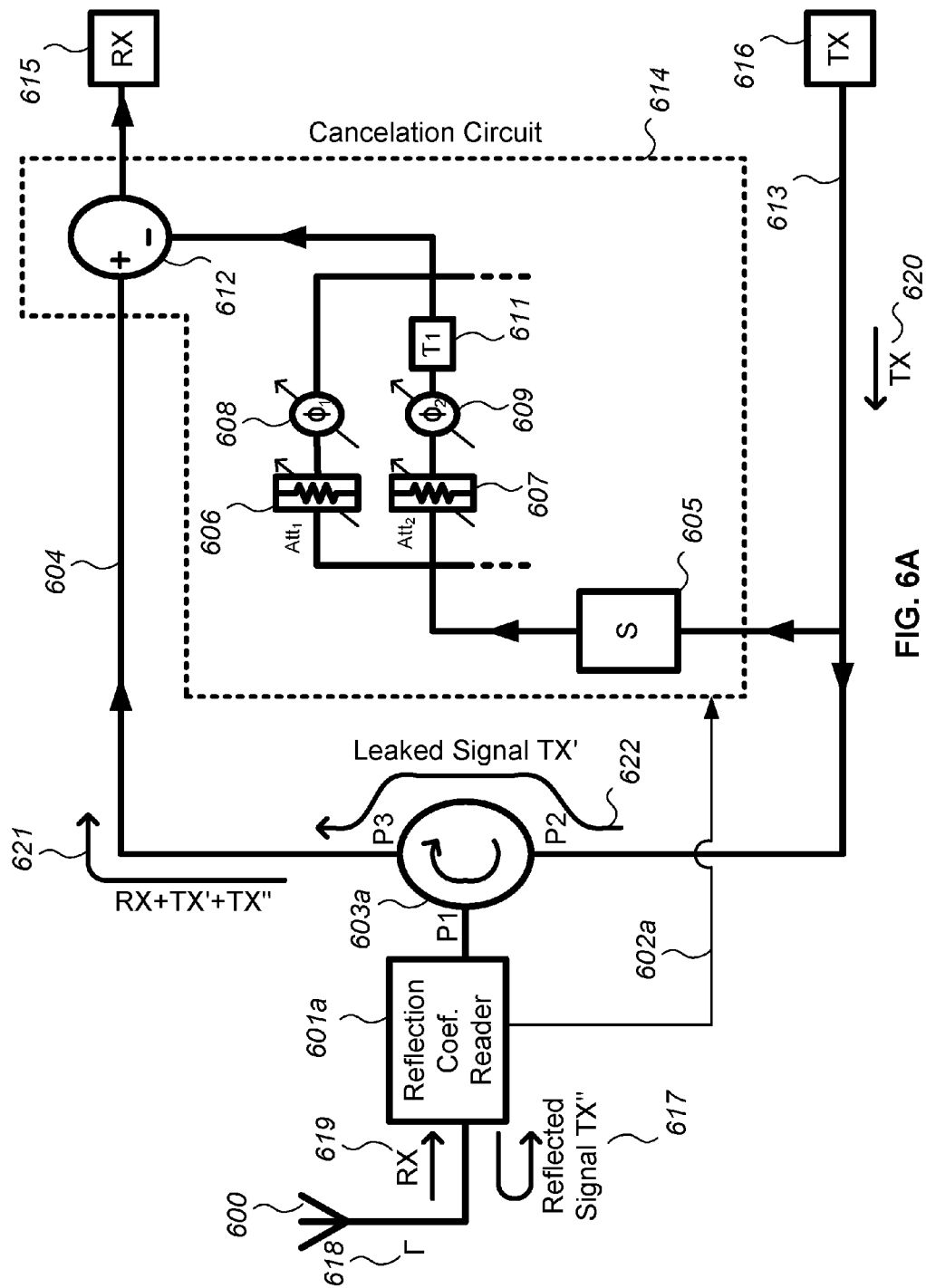
FIG. 6A illustrates an example of a system with feed-forward cancelation.

FIG. 6A demonstrates a possible setup where the disclosed method could be used to cancel the TX signal that leaks into the RX path. The discriminator 103 can be a circulator 603a, for example. Block S 605 is any circuit that blocks a significant portion of the TX band of TX signal, but allows a significant portion of the RX band of the TX signal to pass through to the rest of the cancelation circuit 614. For instance, block S 605 could be a pass-band, low-pass, or high-pass filter, or it could be a circuit that, at RX frequency or band, is impedance matched with path 613, but at TX frequency or band, exhibits poor impedance matching.

In the example shown in FIG. 6A, the cancelation circuit 614 has two or more paths, one or more of which contain static time delays 611. The leaked signal TX' is caused by the limited isolation from port P2 to P3 in the circulator 603a. The reflected signal TX" is caused by the impedance mismatch of the antenna 600.

In the example shown in FIG. 6A, a reflection coefficient reader 601a, continuously monitors the reflection coefficient of the antenna 600 and sends this information to the cancelation circuit 614.

Figure 6B:
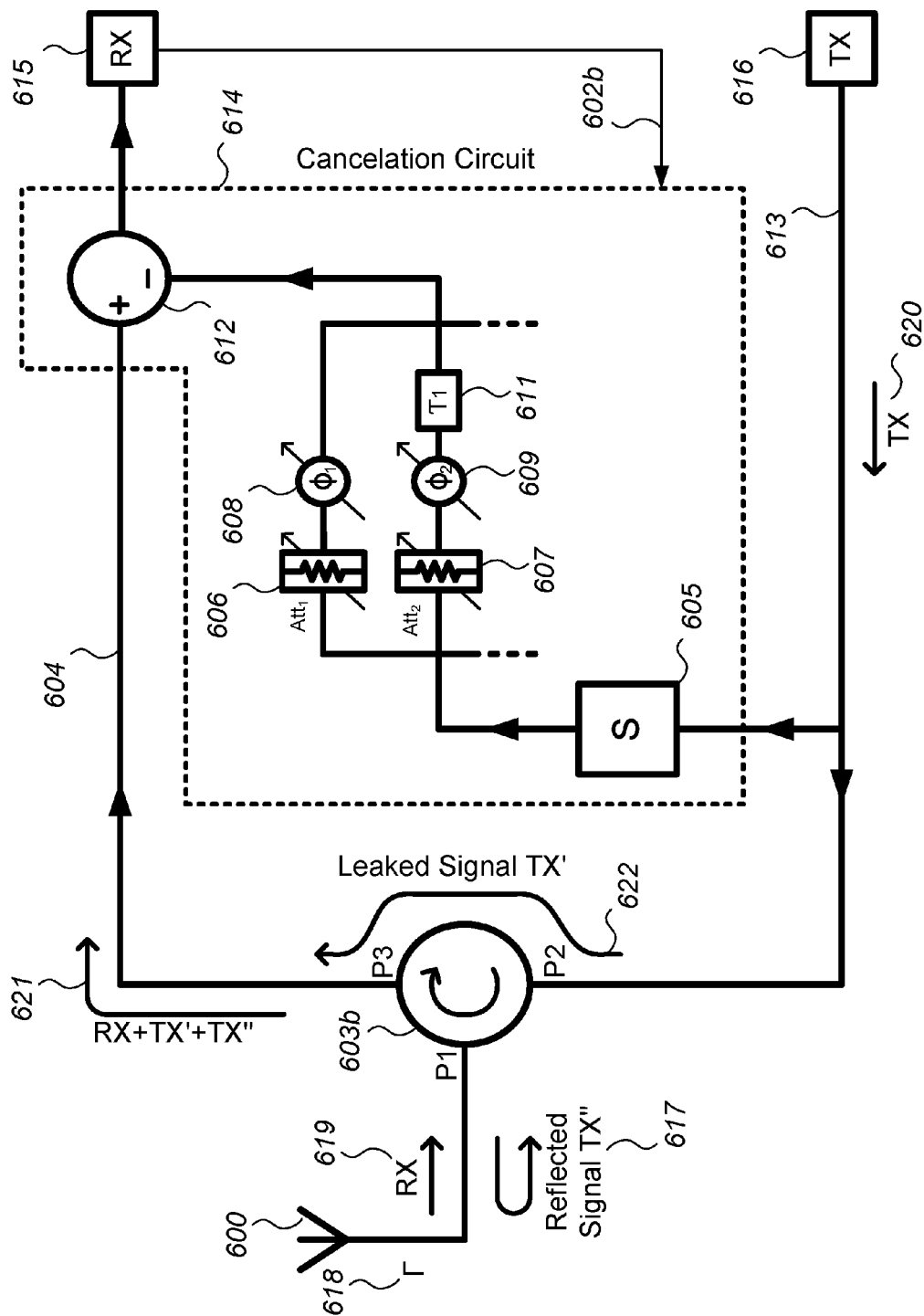
FIG. 6B illustrates an example of a system with feed-forward cancelation.

FIG. 6B demonstrates a possible setup where the disclosed method could be used to cancel the TX signal that leaks into the RX path. It is similar to FIG. 6A except that there is no reflection coefficient reader 601a and the information on the reflection coefficient comes from the receiver 615.

Figure 6C:
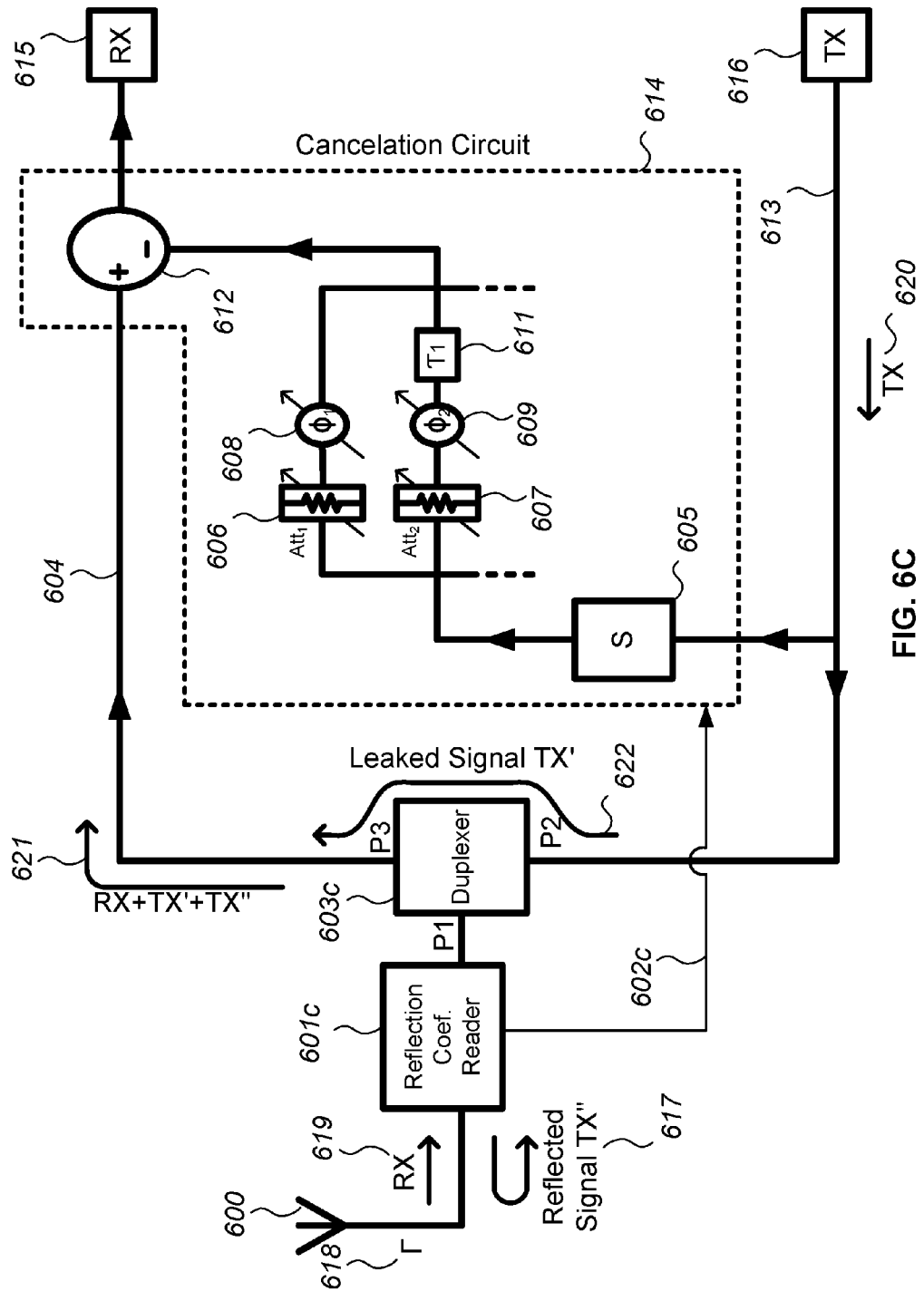
FIG. 6C illustrates an example of a system with feed-forward cancelation.

FIG. 6C demonstrates a possible setup where the disclosed method could be used to cancel the TX signal that leaks into the RX path. It is similar to FIG. 6A except that the discriminator is a duplexer 603c rather than a circulator 603a.

Figure 6D:
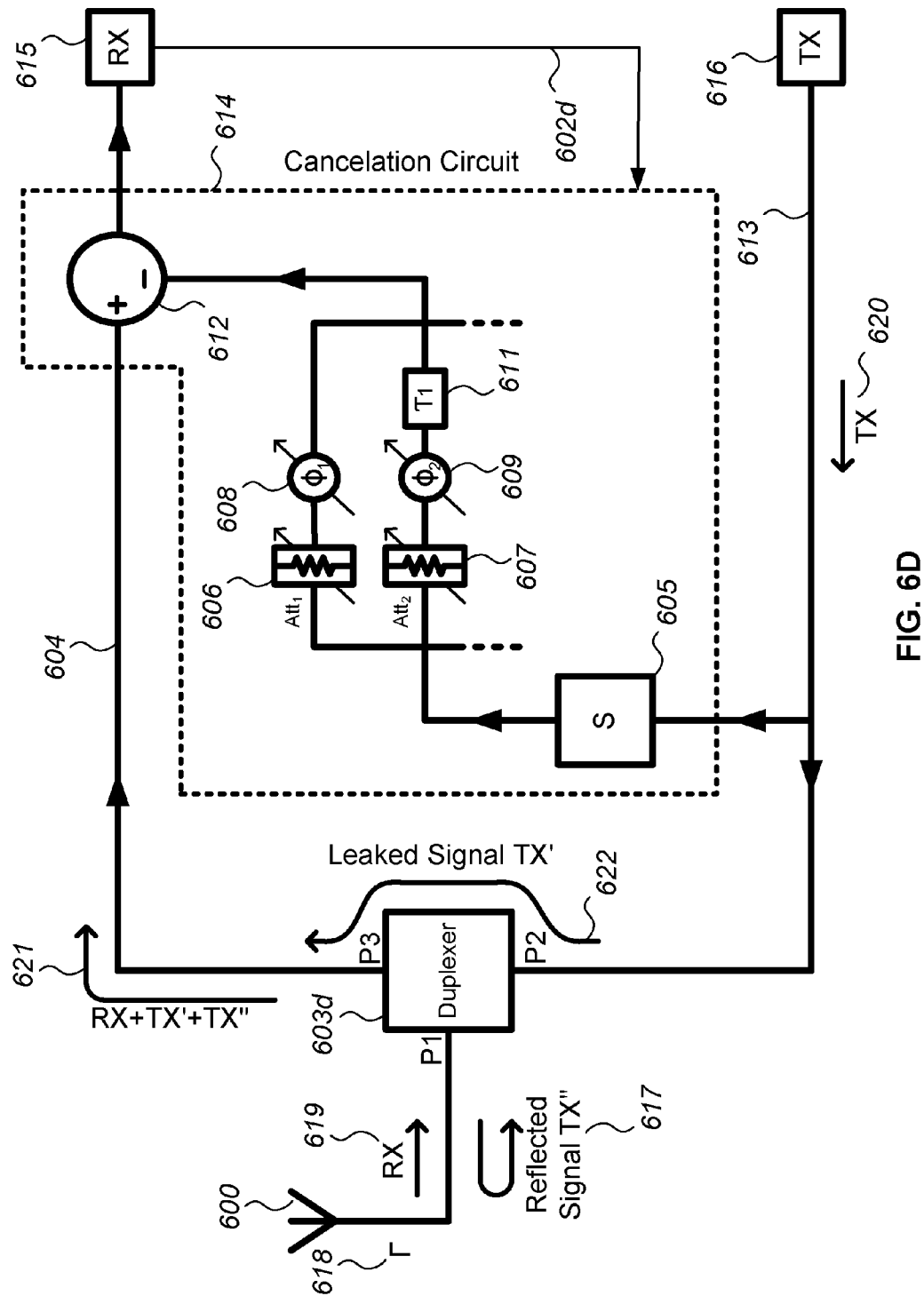
FIG. 6D illustrates an example of a system with feed-forward cancelation.

FIG. 6D demonstrates a possible setup where the disclosed method could be used to cancel the TX signal that leaks into the RX path. It is similar to FIG. 6A except that there is no reflection coefficient reader 601a and the information on the reflection coefficient comes from the receiver 615 and that the discriminator is a duplexer 603d rather than a circulator 603a.

Figure 7A:
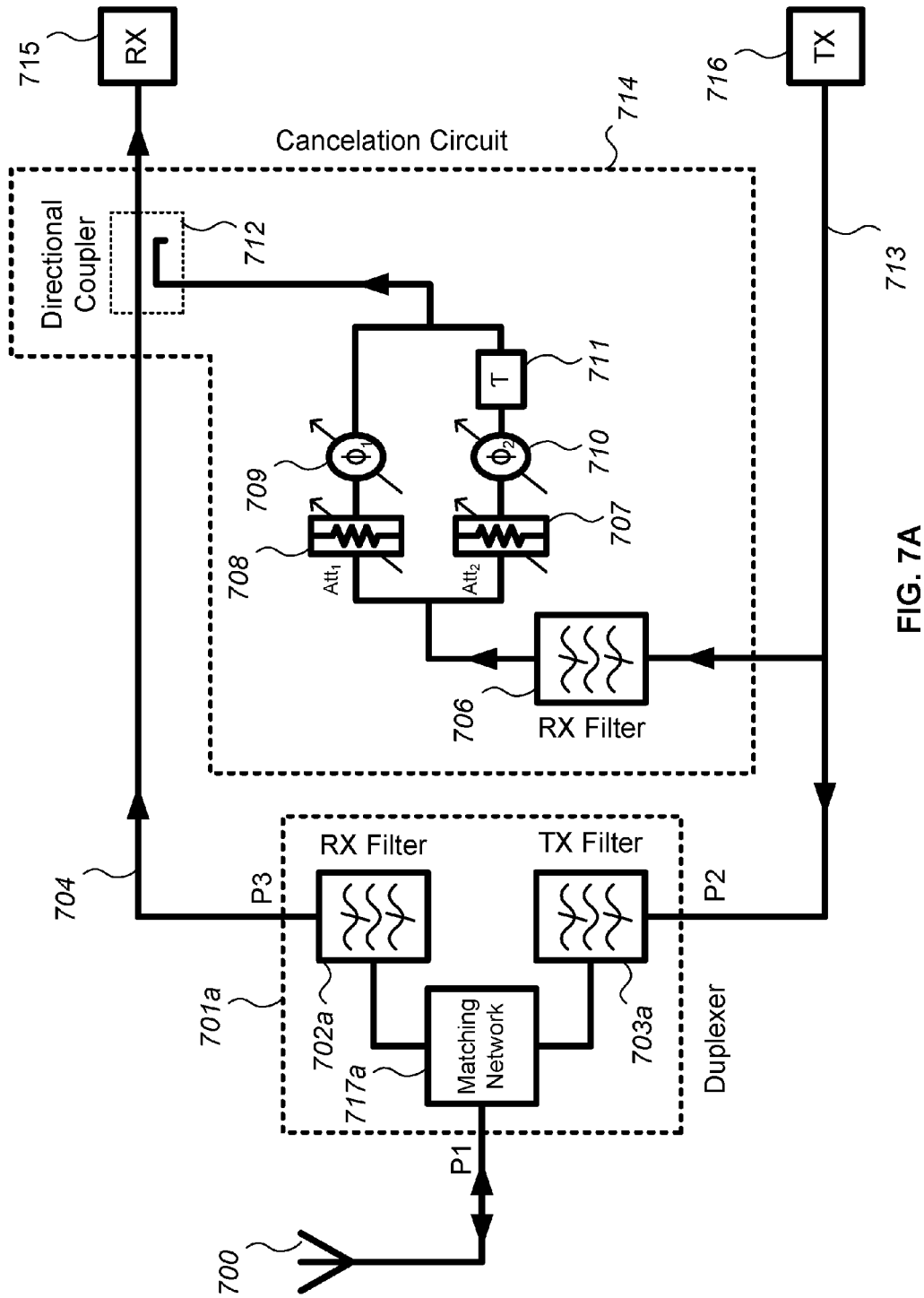
FIG. 7A illustrates an example of a system with feed-forward cancelation.

FIG. 7A demonstrates another possible setup. This is a common setup seen in wireless devices supporting frequency division duplexing (FDD). The discriminator is a duplexer 701a, which consists of an RX filter 702a and a TX filter 703a. The RX filter 706 in the cancelation circuit 714 allows the RX band of the TX signal to enter the cancelation circuit 714 while blocking the TX band of the TX signal. In this example, the cancelation circuit 714 has two paths, one of the paths contains a static time delays 711. The cancelation is done using a directional coupler 712.

Figure 7B:
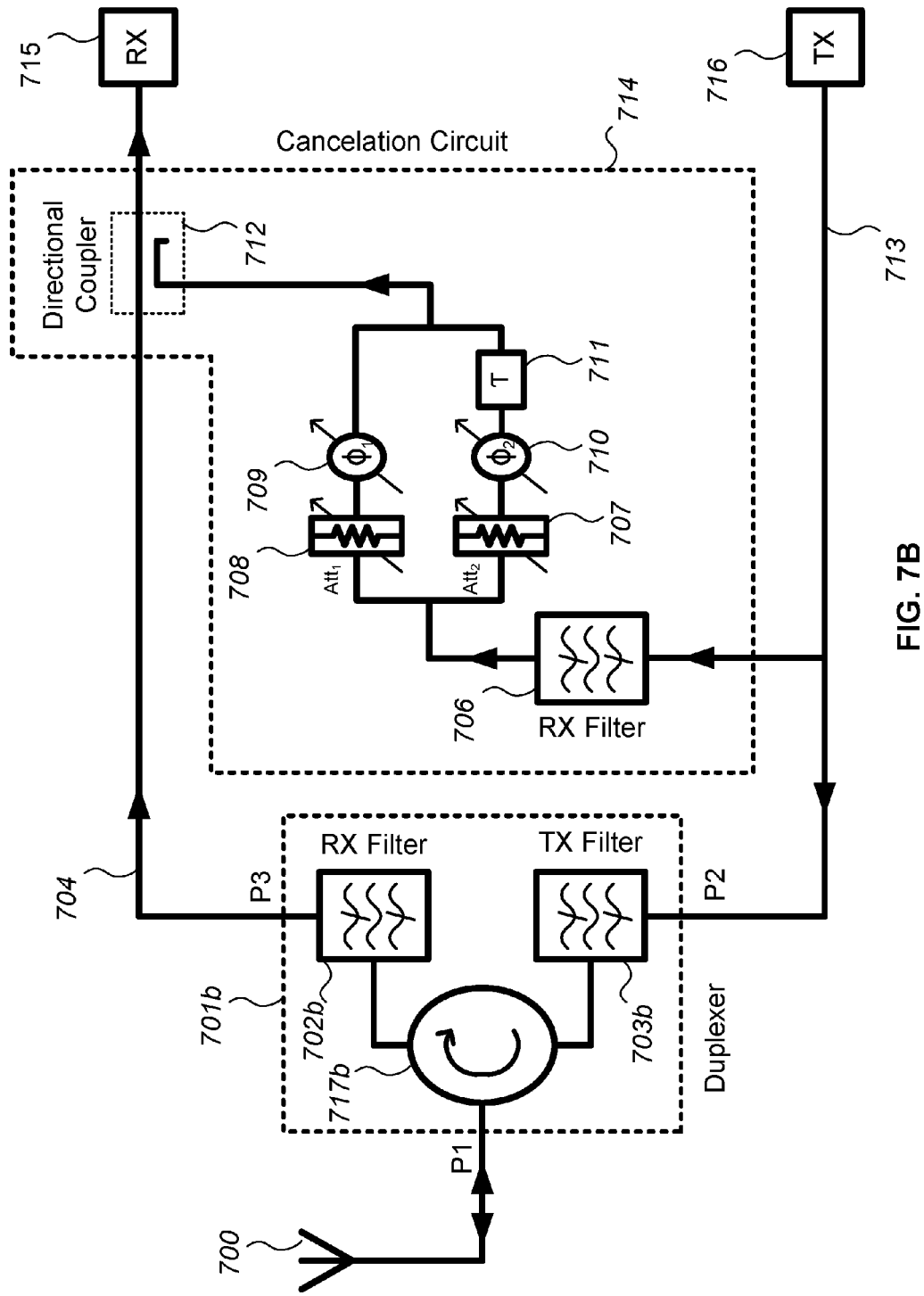
FIG. 7B illustrates an example of a system with feed-forward cancelation.

FIG. 7B demonstrates a possible setup where the disclosed method could be used. It is similar to FIG. 7A, except that instead of a matching network 717a, a circulator 717b is used.

Although not explicitly shown, other combinations of filters, impedance matching networks, and circulators may be used as well.

Figure 8:
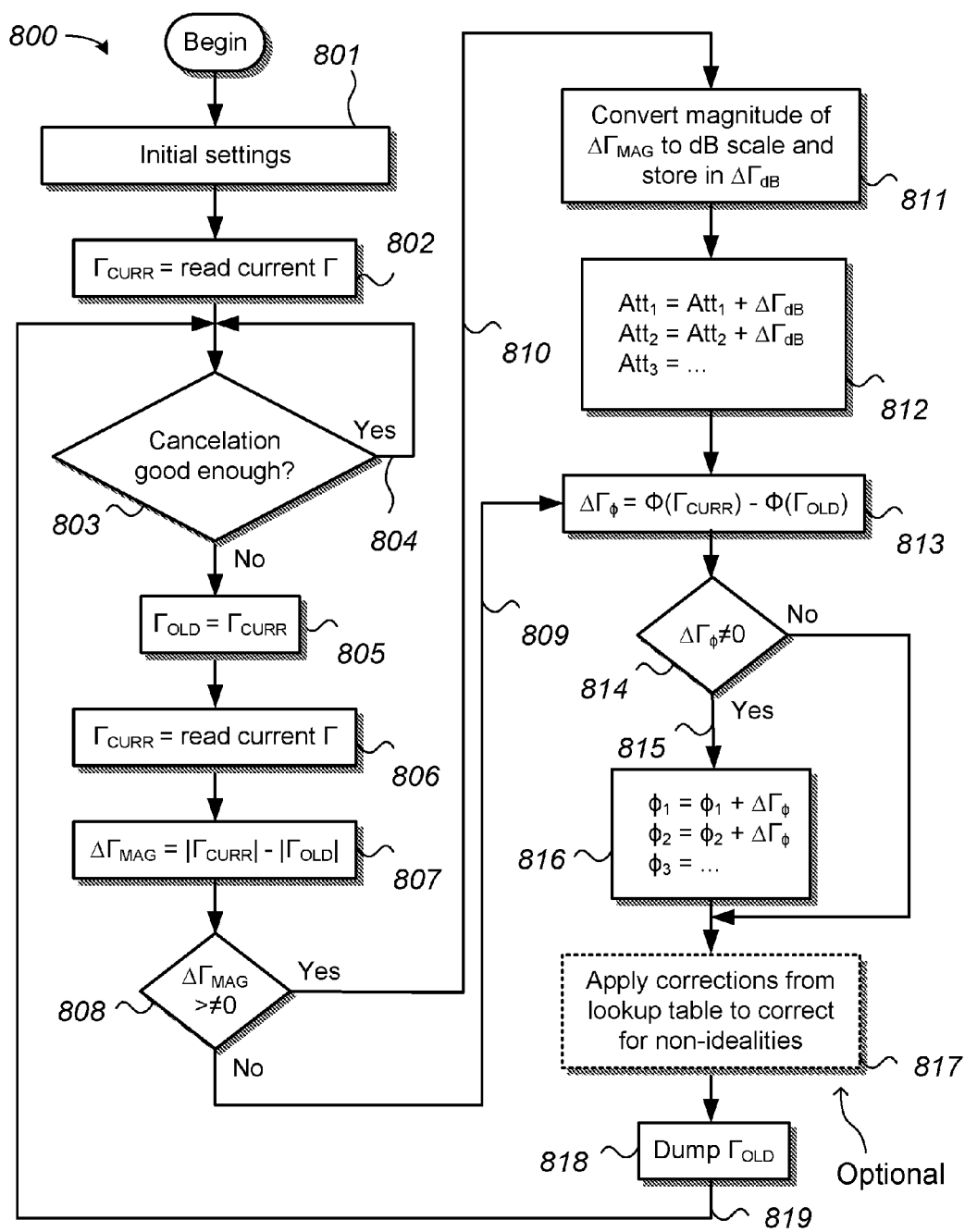
FIG. 8 illustrates the method to maintain good cancelation.

FIG. 8 illustrates a method 800 to maintain good cancelation. This method 800 starts from an initial setting 801 for the variable components, such as variable attenuators, variable phase shifters, and variable time delays, in the feed-forward canceller. The initial setting is stored and applied to the corresponding circuits. The initial state may be determined by a control device 210, for example, or it may be provided to the system by an external means. The initial state may correspond to a nominal impedance for the transmission medium, for instance, 50 ohms. The initial state may be determined by the system during run time, or may be pre-programmed in the system as a default state.

In the following step 802, the current reflection coefficient, $\Gamma_{CURR}$, is determined. The reflection coefficient can be determined, for example, captured or estimated, from an explicit reflection coefficient reader or indirectly from any other source.

The amount of cancelation is monitored 803. If the amount of cancelation is less than a desirable amount, the scheme attempts to change the conditions to regain a desirable amount of cancelation, first by first saving the old value of the reflection coefficient, $\Gamma_{CURR}$, in the variable $\Gamma_{OLD}$ 805, and then determining the new value of $\Gamma$ and storing it in $\Gamma_{CURR}$ 806.

The difference between the amplitudes of $\Gamma_{CURR}$ and $\Gamma_{OLD}$ is stored in $\Delta\Gamma_{MAG}$ 807. If the amplitude $\Delta\Gamma_{MAG}$ has changed 808, it is first converted to a similar unit as our variable attenuator, such as in decibels (dB) 811, then change the value of every variable attenuator proportional to $\Delta\Gamma_{MAG}$ 812. By doing so, the difference between the values of the variable attenuators stays the same.

Then, the difference between the phase of $\Gamma_{CURR}$ and $\Gamma_{OLD}$ is stored in $\Delta\Gamma_{\phi}$ 813. If the phase of $\Gamma$ has changed, or in other words if $\Delta\Gamma_{\phi}$ is not zero 815, the value of every phase shifter changes proportional to the change in the phase of $\Gamma$ 816, or by the amount $\Delta\Gamma_{\phi}$. By doing so, the difference between the values of the variable phase shifter stays the same. The value of every phase wraps around from 360 degrees to 0 degree.

There may be an optional step 817. In this step, the setting for the variable attenuators and phase shifter may be adjusted using a lookup table to correct for non-idealities and nonlinearities.

Before repeating most of the method, dump the value of $\Gamma_{OLD}$ 818 and repeat starting at 803.

Figure 9:
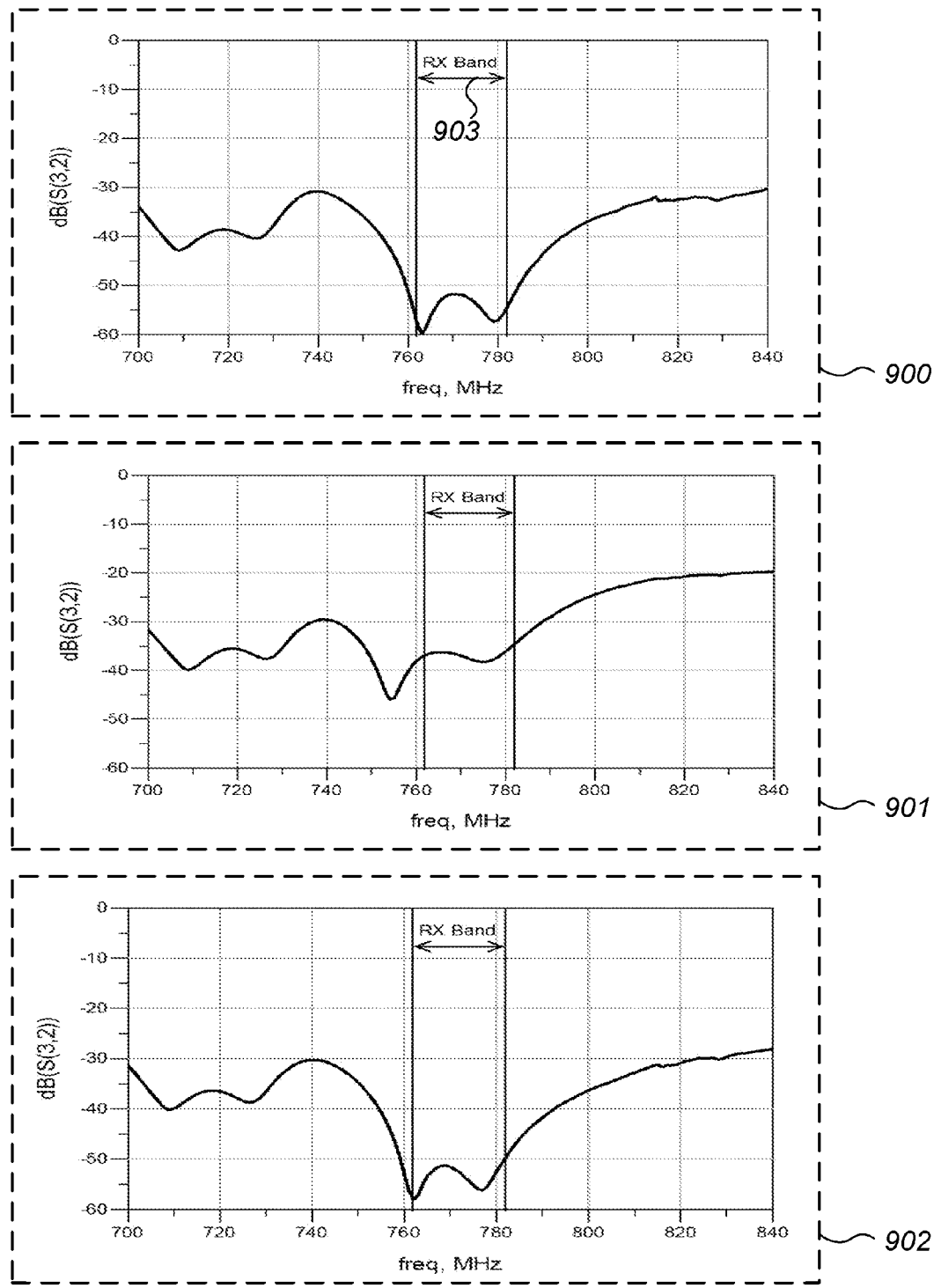
FIG. 9 is a graph of the results of the method in action after a change in the phase of the reflection coefficient.

FIG. 9 is a graph of results showing when the phase of the reflection coefficient, $\Gamma$, is changed, how the method will help to bring back the cancelation level to a desirable level.

The first graph 900 shows the amount of transmitter signal, TX, that has leaked and made its way to the receiver. In this case, we only care about the receive band which is marked in each graph and labeled RX band 903, and the desirable amount of cancelation was 50 dB in the RX Band 903. Also, in this result, the transmitter is the port 2 of the S-parameter and the receiver is the port 3 of S-parameter, and so in other words, S32 is the isolation of the receiver from the transmitter in dB (shown as dB(S(3,2)) in the graphs).

The second graph 901 shows the effect of a change in the reflection coefficient of the transmission medium 100 on the amount of the transmitter signal that has leaked to the receive signal before the disclosed method was used. As could be seen, more transmit signal has leaked to the receive signal and we are no more satisfying the desired minimum of −50 dB isolation. In this case, the phase of the reflection coefficient was changed from 0 to 70 degrees.

The third graph 902 shows the result after the disclosed method was applied. As it could be seen, the leaked transmitter signal has been canceled from the receive signal to an acceptable level which is below −50 dB. As can be seen, the new isolation level, after completion of the proposed algorithm, need not be identical to that of the circuit prior to change in the reflection coefficient and invoking the algorithm.

Figure 10:
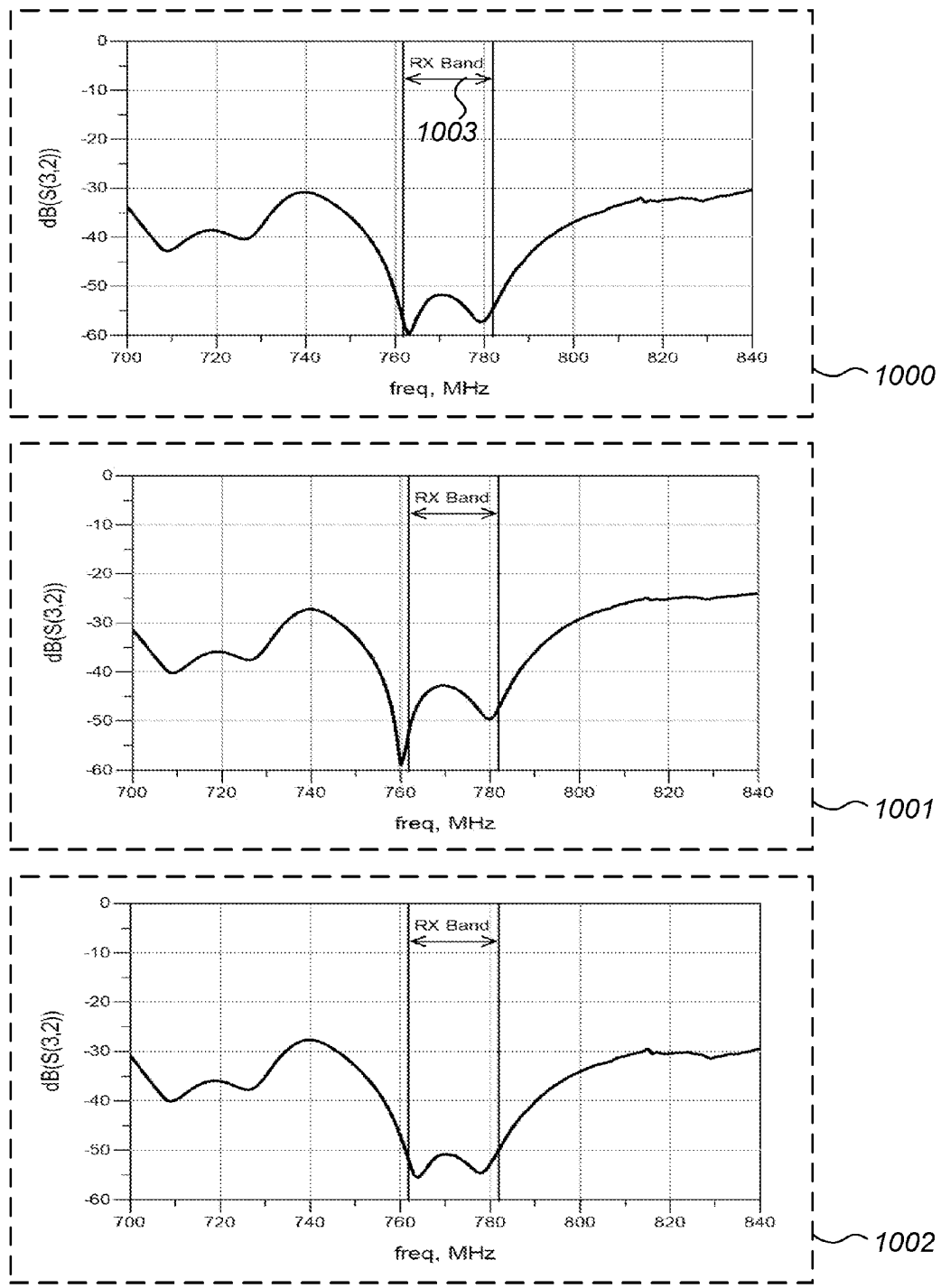
FIG. 10 is a graph of the results of the method in action after a change in the amplitude of the reflection coefficient.

FIG. 10 is a graph of results showing when the amplitude of the reflection coefficient, $\Gamma$, is changed, how the method will help to bring back the cancelation level to a desirable level.

The first graph 1000 shows the amount of transmitter signal, TX, that has leaked and made its way to the receiver. In this case, we only care about the receive band which is marked in each graph and labeled RX band 1003, and the desirable amount of cancelation was 50 dB in the RX Band 1003. Also, in this result, the transmitter is the port 2 of the S-parameter and the receiver is the port 3 of S-parameter, and so in other words, S32 is the isolation of the receiver from the transmitter in dB.

The second graph 1001 shows the effect of a change in the reflection coefficient of the transmit medium 100 on the amount of the transmitter signal that has leaked to the receive signal before the method was used. As could be seen, more transmit signal has leaked to the receive signal and we are no more satisfying our minimum of −50 dB isolation. In this case, the amplitude of the reflection coefficient was changed from 0.50 to 0.67 which is the same as changing from Voltage Standing Wave Ratio (VSWR) of 3 to VSWR of 5.

The third graph 1002 shows the result after the disclosed method was applied. As it could be seen, the leaked transmitter signal has been canceled from the receive signal to an acceptable level which is below −50 dB.

The disclosed method is applicable to cases where either or both of amplitude and phase of reflection coefficient change.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for tuning feed-forward canceller.

Accordingly, aspects of the present disclosure may be realized in hardware, software, or a combination of hardware and software. The present disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

Aspects of the present disclosure may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for tuning an electronic circuit to cancel a leaked transmitter signal under changeable impedance of a transmission medium, the method comprising:
   determining, by a control device, a setting of variable components in the electronic circuit to achieve a desirable cancelation level at an impedance of the transmission medium;
   determining a value of a reflection coefficient of the transmission medium; and
   changing the setting of the variable components in the electronic circuit, based on the determined value of the reflection coefficient, in proportion to a change between the determined value and an old value of the reflection coefficient, both in amplitude and phase, to maintain the desirable cancelation level, wherein the electronic circuit comprises two or more variable attenuators, two or more variable phase shifters, and a circuitry or circuit element to achieve a signal cancelation.

2. The method as recited in claim 1, wherein the electronic circuit is a feed-forward canceller.

3. The method as recited in claim 1, wherein the electronic circuit includes one or more elements that provide delay or group delay.

4. The method as recited in claim 1, wherein the method is used for a discriminator in a communication system.

5. The method as recited in claim 1, wherein the method is used for a discriminator in a frequency division duplex wireless communication system.

6. The method as recited in claim 1, wherein the method is used for a discriminator in a radar system.

7. The method as recited in claim 1, wherein the method is used for a discriminator that includes one or more of a duplexer, a multiplexer, and a circulator.

8. The method as recited in claim 1, wherein the value of the reflection coefficient is determined directly from a reflection coefficient reader.

9. The method as recited in claim 1, wherein the electronic circuit comprises an integrated circuit.

10. A feed-forward cancelation system, comprising:
an input port corresponding to a transmitter;
an output port corresponding to a receiver;
a cancelation circuit coupled to the input port and the output port and configured to substantially cancel a leaked transmitter signal at the receiver;
a discriminator that couples a transmission medium with changeable impedance to the receiver and the transmitter; and
a control device coupled to the cancelation circuit and configured to:
determine a setting of variable components in the cancelation circuit to achieve a desirable cancelation level of the transmitter signal at the receiver under an impedance of the transmission medium,
determine a value of a reflection coefficient of the transmission medium, and
change the setting of the variable components in the cancelation circuit, based on the determined value of the reflection coefficient, in proportion to a change between the determined value and an old value of the reflection coefficient, both in amplitude and phase, to maintain the desirable cancelation level.

11. The feed-forward cancelation system recited in claim 10, wherein the cancelation circuit comprises two or more variable attenuators, two or more variable phase shifters, and a circuitry or circuit element to achieve a signal cancelation.

12. The feed-forward cancellation system recited in claim 11, wherein the cancelation circuit includes one or more elements that provide delay or group delay.

13. The feed-forward cancelation system recited in claim 10, wherein the feed-forward cancelation system is utilized for the discriminator in a wireless communication system, the cancelation circuit cancels the leaked transmitter signal leaked through the discriminator or reflected at an antenna, and the discriminator includes an imperfect duplexer or an imperfect circulator.

14. The feed-forward cancelation system recited in claim 10, wherein the feed-forward cancelation system is utilized for the discriminator in a wire-based communication system, the cancelation circuit cancels the leaked transmitter signal leaked through the discriminator or reflected at a transmission cable, and the discriminator includes an imperfect duplexer or an imperfect circulator.

15. The feed-forward cancelation system recited in claim 10, wherein the value of the reflection coefficient is determined directly from a reflection coefficient reader.

16. The feed-forward cancelation system recited in claim 10, wherein the feed-forward cancelation system is utilized for the discriminator in a communication system.

17. The feed-forward cancelation system recited in claim 10, wherein the feed-forward cancelation system is utilized for the discriminator in a frequency division duplex wireless communication system.

18. The feed-forward cancelation system recited in claim 10, wherein the feed-forward cancelation system is utilized for the discriminator in a radar system.

19. The feed-forward cancelation system recited in claim 10, wherein the feed-forward cancelation system is utilized for the discriminator that includes one or more of a duplexer, a multiplexer, and a circulator.

\* \* \* \* \*